(12) United States Patent
Jia et al.

(10) Patent No.: US 10,010,001 B1
(45) Date of Patent: Jun. 26, 2018

(54) CIRCUIT BOARD AND METHOD FOR MAKING THE SAME

(71) Applicants: Avary Holding (Shenzhen) Co., Limited, Shenzhen (CN); HongQiSheng Precision Electronics (QinHuangDao) Co., Ltd., Qinhuangdao (CN)

(72) Inventors: Meng-Lu Jia, Shenzhen (CN); Hai-Bo Qin, Shenzhen (CN)

(73) Assignees: Avago Holding (Shenzhen) Co., Limited., Shenzhen (CN); HongQiSheng Precision Electronics (QinHuangDao) Co, Qinhuangdao (CN)

( * ) Notice: Subject to any disclaimer, the term of this patent is extended or adjusted under 35 U.S.C. 154(b) by 0 days. days.

(21) Appl. No.: 15/841,773

(22) Filed: Dec. 14, 2017

(30) Foreign Application Priority Data

Nov. 10, 2017 (CN) .......................... 2017 1 1107887

(51) Int. Cl.
| | |
|---|---|
| *H05K 1/11* | (2006.01) |
| *H05K 3/40* | (2006.01) |
| *H05K 3/42* | (2006.01) |
| *H05K 3/00* | (2006.01) |
| *H05K 1/02* | (2006.01) |

(52) U.S. Cl.
CPC ........... *H05K 3/427* (2013.01); *H05K 1/0298* (2013.01); *H05K 3/0011* (2013.01); *H05K 3/0017* (2013.01); *H05K 3/4038* (2013.01)

(58) Field of Classification Search
CPC ........ H05K 1/111; H05K 1/115; H05K 1/117; H05K 1/118; H05K 1/119; H05K 3/0017; H05K 3/4038; H05K 3/429
See application file for complete search history.

(56) References Cited

U.S. PATENT DOCUMENTS

| | | | |
|---|---|---|---|
| 2013/0126224 A1* | 5/2013 | Kim .......................... | H05K 1/11 174/262 |
| 2014/0084955 A1* | 3/2014 | Teng .................. | G01R 1/07378 324/756.03 |
| 2015/0107880 A1* | 4/2015 | Kim ....................... | H05K 1/185 174/255 |

* cited by examiner

*Primary Examiner* — Jeremy C Norris
(74) *Attorney, Agent, or Firm* — ScienBiziP, P.C.

(57) ABSTRACT

A circuit board comprises a third conductive circuit layer, a third insulating layer, a first insulating layer, a first conductive circuit layer, a substrate, a second conductive circuit layer, a second insulating layer, a fourth insulating layer, and a fourth conductive circuit layer in that order from top to bottom. The circuit board defines at least one first conductive hole and at least one second conductive hole. Each one of the first conductive hole comprises a first conductive blind hole, and a third conductive blind hole aligned with and electrically connected to the first conductive blind hole. Each one of the second conductive hole comprises a second conductive blind hole, and a fourth conductive blind hole aligned with and electrically connected to the second conductive blind hole. A method for making the circuit board is also provided.

18 Claims, 4 Drawing Sheets

CIRCUIT BOARD AND METHOD FOR MAKING THE SAME

FIELD

The subject matter herein generally relates to a circuit board, and a method for making the circuit board.

BACKGROUND

Circuit board includes conductive blind holes. The conductive blind hole electrically connects at least two conductive circuit layers. The conductive blind hole is formed by drilling hole, and then plating conductive metal in the hole. A circuit board having a conductive blind hole with a big ratio of hole depth to hole diameter can be designed for dense line with high reliability. Thus, a new circuit board in which the conductive blind hole with a big ratio of hole depth to hole diameter is preferred.

BRIEF DESCRIPTION OF THE DRAWINGS

Implementations of the present disclosure will now be described, by way of example only, with reference to the attached figures.

DETAILED DESCRIPTION

Figure 1:
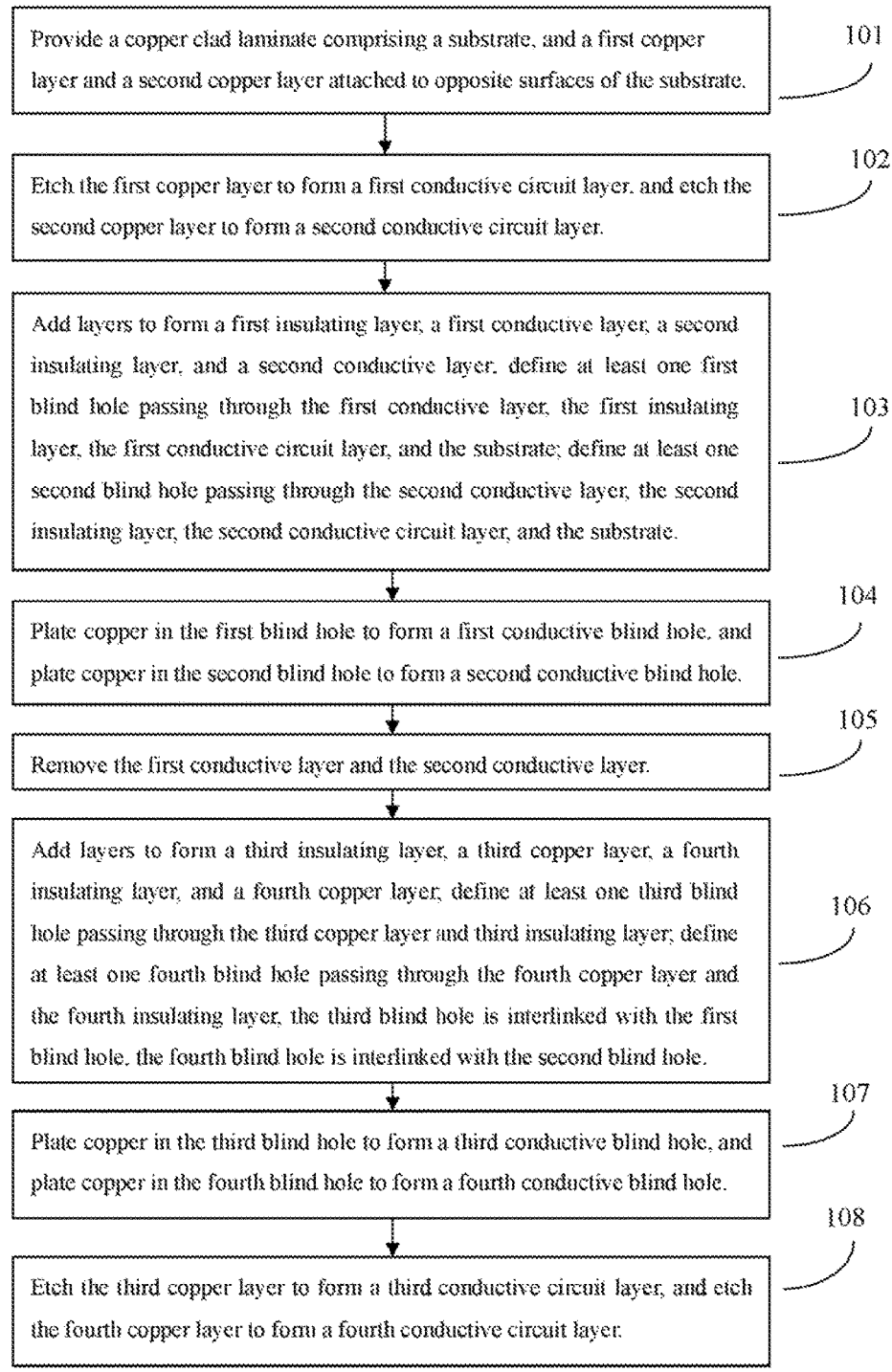
FIG. 1 is a flowchart of a method for making a circuit board in accordance with an exemplary embodiment of the present disclosure.

It will be appreciated that for simplicity and clarity of illustration, where appropriate, reference numerals have been repeated among the different figures to indicate corresponding or analogous elements. In addition, numerous specific details are set forth to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising" when utilized, means "including, but not necessarily limited to"; it specifically indicates open-ended inclusion or membership in the so-described combination, group, series, and the like. The term "about" when utilized, means "not only includes the numerical value, but also includes numbers closest to the numerical value".

FIG. 1 illustrates a flowchart of a method for making a circuit board 100 (shown in FIG. 9) in accordance with an exemplary embodiment. The exemplary method is provided by way of example, as there are a variety of ways to carry out the method. Each block shown in the figure represents one or more processes, methods, or subroutines, carried out in the exemplary method. Furthermore, the illustrated order of blocks is by example only and the order of the blocks can change. Additional blocks may be added or fewer blocks may be utilized, without departing from this disclosure. The exemplary method may begin at block 101.

Figure 2:
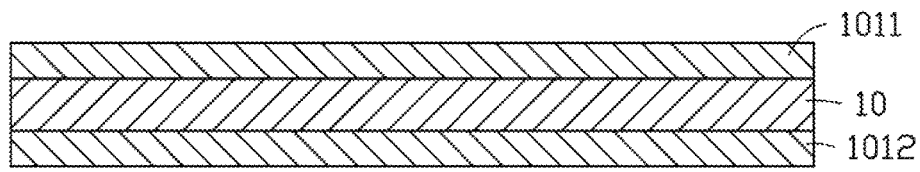
FIG. 2 is a diagram of a copper clad laminate in accordance with an exemplary embodiment.

At block 101, referring to FIG. 2, a copper clad laminate 101 is provided.

The copper clad laminate 101 includes a substrate 10, a first copper layer 1011, and a second copper layer 1012. The first copper layer 1011 and the second copper layer are attached to opposite surfaces of the substrate 10.

In at least one exemplary embodiment, the substrate 10 is a polyimide substrate.

Figure 3:
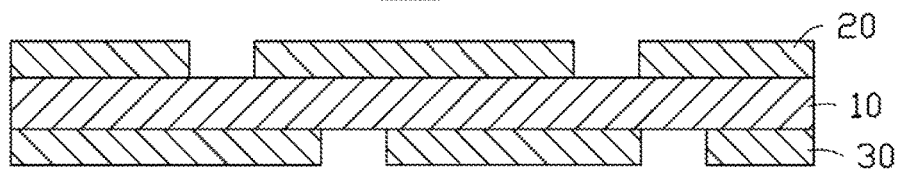
FIG. 3 is a diagram of a core circuit board.

At block 102, referring to FIG. 3, the first copper layer 1011 is made into a first conductive circuit layer 20, the second copper layer 1012 is made into a second conductive circuit layer 30, thus a core circuit board 102 is achieved.

In at least one exemplary embodiment, a method for making the first copper layer 1011 into a first conductive circuit layer 20 and a method for making the second copper layer 1012 into a second conductive circuit layer 30 are by etching or laser cutting.

Figure 4:
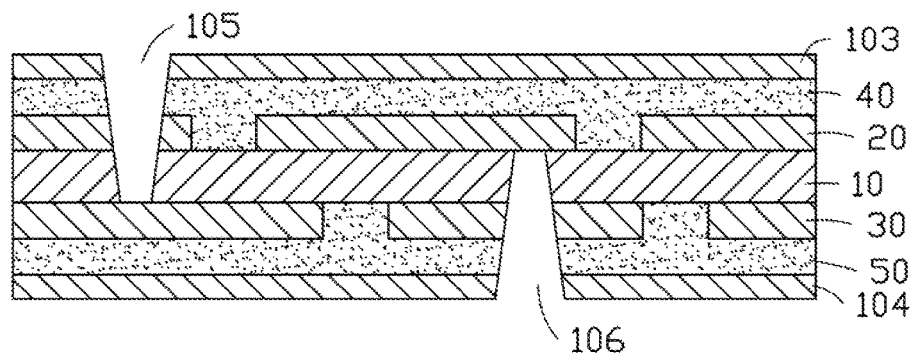
FIG. 4 is a diagram of the core circuit board of FIG. 3 with added layers and formed with a first blind hole and a second blind hole.

At block 103, referring to FIG. 4, layers are added to the core circuit board 102, to form a first insulating layer 40 attached to a surface of the first conductive circuit layer 20 away from the substrate 10, to form a first conductive layer 103 attached to a surface of the first insulating layer 40 away from the first conductive circuit layer 20, to form a second insulating layer 50 attached to a surface of the second conductive circuit layer 30 away from the substrate 10, and to form a second conductive layer 104 attached to a surface of the second insulating layer 50 away from the second conductive circuit layer 30. At least one first blind hole 105 passing through the first conductive layer 103, the first insulating layer 40, the first conductive circuit layer 20, and the substrate 10 in that order is defined, and at least one second blind hole 106 passing through the second conductive layer 104, the second insulating layer 50, the second conductive circuit layer 30, and the substrate 10 in that order is defined. The central axes of the first blind hole 105 and second blind hole 106 are not co-axial.

The first conductive layer 103 and the second conductive layer 104 are made of copper, aluminium, gold, silver, platinum, conductive plastic, or conductive rubber.

In at least one exemplary embodiment, a method for defining the first blind hole 105 and the second blind hole 106 is by etching or laser cutting.

Figure 5:
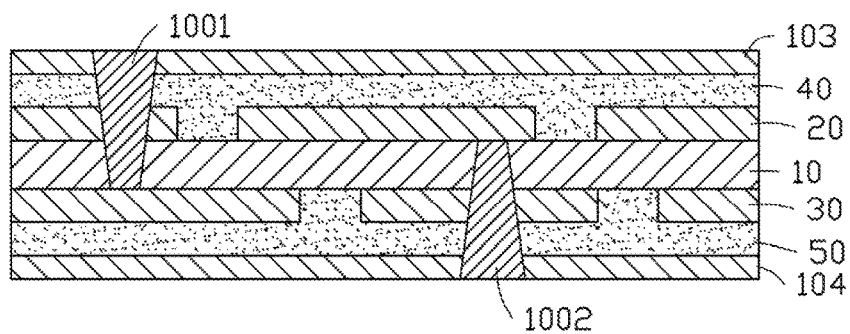
FIG. 5 is a diagram of the first blind hole and the second blind hole of FIG. 4 plated with copper.

At block 104, referring to FIG. 5, the first blind hole 105 is plated with copper to form a first conductive blind hole 1001, the second blind hole 106 is plated with copper to form a second conductive blind hole 1002.

In at least one exemplary embodiment, the copper can be replaced by aluminium, gold, silver, or platinum.

Figure 6:
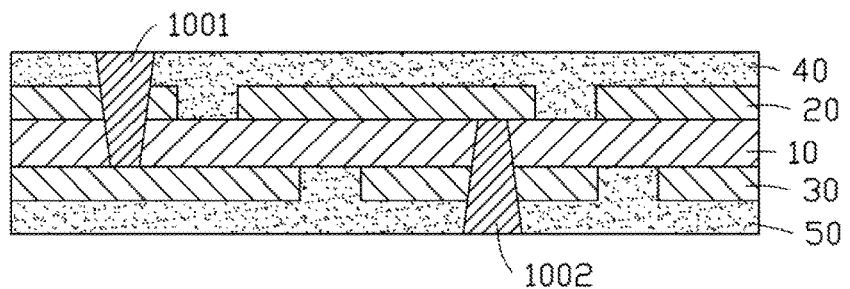
FIG. 6 is a diagram of the first conductive layer and second conductive layer of FIG. 5 removed.

At block 105, referring to FIG. 6, the first conductive layer 103 and the second conductive layer 104 are removed.

In at least one exemplary embodiment, a method for removing the first conductive layer 103 and the second conductive layer 104 is by exposure and development.

Figure 7:
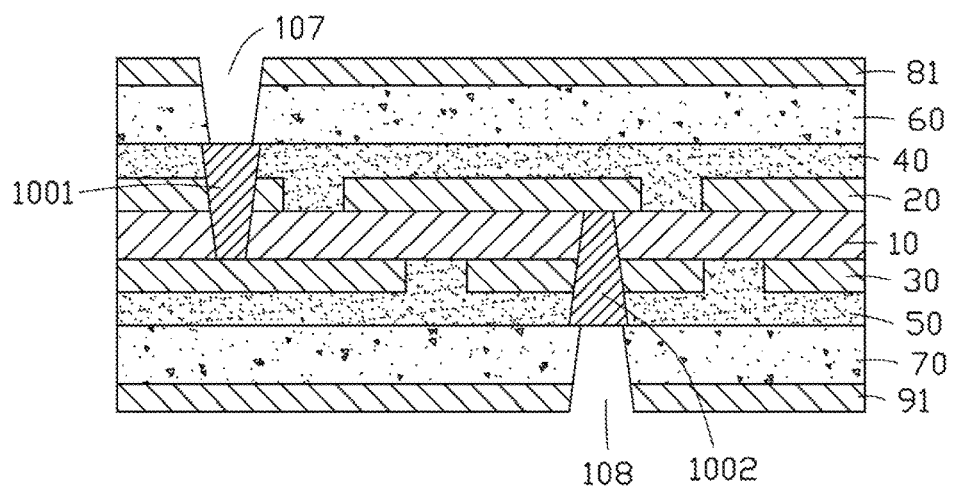
FIG. 7 is a diagram of additional layers and a third blind hole and a fourth blind hole added to the circuit board of FIG. 6.

At block 106, referring to FIG. 7, a third insulating layer 60 is formed on a surface of the first insulating layer 40 away from the first conductive circuit layer 20, a third copper layer 81 is form on a surface of the third insulating layer 60 away from the first insulating layer 40, a fourth insulating layer 70 is formed on a surface of the second insulating layer 50 away from the second conductive circuit layer 30, a fourth copper layer 91 is form on a surface of the fourth insulating layer 70 away from the second insulating layer 50, and at least one third blind hole 107 and at least one fourth blind hole 108 are defined. The third blind hole 107 passes through the third copper layer 81 and the third insulating layer 60. The third blind hole 107 is effectively a continuation of the first blind hole 105, in other words, the third blind hole 107 is interconnected with the first blind hole 105, or a bottom surface of the third blind hole 107 is a surface of the first conductive blind hole 1001. The fourth blind hole 108 passes through the fourth copper layer 91 and the fourth insulating layer 70. The fourth blind hole 108 is effectively a continuation of the second blind hole 106, in other words, the fourth blind hole 108 is interconnected with the second blind hole 106, or a bottom surface of the fourth blind hole 108 is a surface of the second conductive blind hole 1002.

In at least one exemplary embodiment, a method for defining the third blind hole 107 and the fourth blind hole 108 is by etching or laser cutting.

Figure 8:
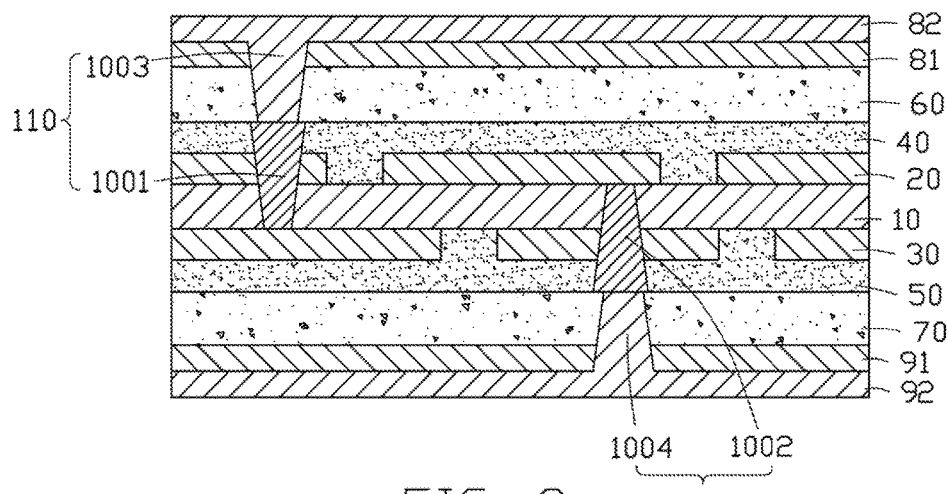
FIG. 8 is a diagram of the third blind hole and fourth blind hole of FIG. 7 plated with conductive metal.

At block 107, referring to FIG. 8, the third blind hole 107 is plated with copper to form a third conductive blind hole 1003, the fourth blind hole 108 is plated with copper to form a fourth conductive blind hole 1004.

In at least one exemplary embodiment, the copper can be replaced by aluminium, gold, silver, or platinum.

The third conductive blind hole 1003 is aligned with and electrically connected to the first conductive blind hole 1001, thus the third conductive blind hole 1003 and the first conductive blind hole 1001 coordinate to form a first conductive hole 110. The fourth conductive blind hole 1004 is aligned with and electrically connected to the second conductive blind hole 1002, thus the fourth conductive blind hole 1004 and the second conductive blind hole 1002 coordinate to form a second conductive hole 120.

The first conductive hole 110 and the second conductive hole 120 are conductive blind holes. A ratio of hole depth to hole diameter of the first conductive hole 110 is equal to or greater than 1. A ratio of hole depth to hole diameter of the second conductive hole 120 is equal to or greater than 1.

A diameter of the first conductive blind hole 1001 gradually decreases along the direction from the first insulating layer 40 toward the second conductive circuit layer 30. A diameter of the third conductive blind hole 1003 gradually decreases along the direction from the third copper layer 81 toward the first insulating layer 40. At the connecting portion of the first conductive blind hole 1001 and the third conductive blind hole 1003, the diameter of the first conductive blind hole 1001 is greater than the diameter of the third conductive blind hole 1003.

A diameter of the second conductive blind hole 1002 gradually decreases along the direction from the second insulating layer 50 toward the first conductive circuit layer 20. A diameter of the fourth conductive blind hole 1004 gradually decreases along the direction from the fourth copper layer 91 toward the second insulating layer 50. At the connecting portion of the second conductive blind hole 1002 and the fourth conductive blind hole 1004, the diameter of the second conductive blind hole 1002 is bigger than the diameter of the fourth conductive blind hole 1004.

Figure 9:
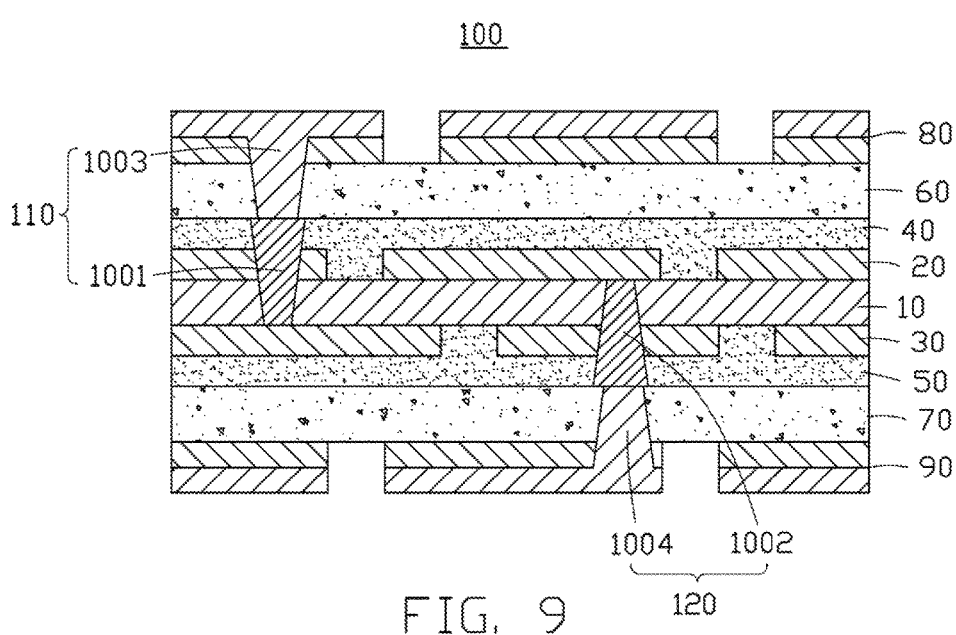
FIG. 9 is a diagram of a finished circuit board in accordance with an exemplary embodiment.

At block 108, referring to FIG. 9, the third copper layer 81 is made into a third conductive circuit layer 80, the fourth copper layer 91 is made into a fourth conductive circuit layer 90, thus a final circuit board 100 is achieved.

In at least one exemplary embodiment, a method for making the third copper layer 81 into a third conductive circuit layer 80 and a method for making the fourth copper layer 91 into a fourth conductive circuit layer 90 are by etching or laser cutting.

The third conductive blind hole 1003 passes through the third conductive circuit layer 80 and the third insulating layer 60. The fourth conductive blind hole 1004 passes through the fourth conductive circuit layer 90 and the fourth insulating layer 70. The first conductive hole 110 electrically connects the third conductive circuit layer 80, the first conductive circuit layer 20, and the second conductive circuit layer 30. The second conductive hole 120 electrically connects the fourth conductive circuit layer 90, the second conductive circuit layer 30, and the first conductive circuit layer 20.

In at least one exemplary embodiment, at block 107, referring to FIG. 8, when plating the third blind hole 107 with copper, a fifth copper layer 82 can be formed on a surface of the third copper layer 81 away from the third insulating layer 60. When plating in the fourth blind hole 108 with copper, a sixth copper layer 92 can be formed on a surface of the fourth copper layer 91 away from the fourth insulating layer 70. Thereby, at block 108, referring to FIG. 9, the third copper layer 81 and the fifth copper layer 82 are made into a third conductive circuit layer 80, and the fourth copper layer 91 and sixth copper layer 92 are made into a fourth conductive circuit layer 90.

In at least one exemplary embodiment, after the third conductive circuit layer 80 and the fourth conductive circuit layer 90 are formed, a first cover layer (not shown) is formed on a surface of the third conductive circuit layer 80 away from the third insulating layer 60, and a second cover layer (not shown) is formed on a surface of the fourth conductive circuit layer 90 away from the fourth insulating layer 70.

FIG. 8 illustrates a circuit board 100 used in an electronic device, such as a computer, a phone, a smart watch, or an electronic reader. In at least one exemplary embodiment, the circuit board 100 is a printed circuit board.

The circuit board 100 includes a substrate 10, a first conductive circuit layer 20 and a second conductive circuit layer 30 attached to opposite surfaces of the substrate, a first insulating layer 40 attached to a surface of the first conductive circuit layer 20 away from the substrate 10, a second insulating layer 50 attached to a surface of the second conductive circuit layer 30 away from the substrate 10, a third insulating layer 60 attached to a surface of the first insulating layer 40 away from the first conductive circuit layer 20, a fourth insulating layer 70 attached to a surface of the second insulating layer 50 away from the second conductive circuit layer 30, a third conductive circuit layer 80 attached to a surface of the third insulating layer 60 away from the first insulating layer 40, and a fourth conductive circuit layer 90 attached to a surface of the fourth insulating layer 70 away from the second insulating layer 50.

The circuit board 100 defines at least one first conductive hole 110 and at least one second conductive hole 120.

The first conductive hole 110 includes a first conductive blind hole 1001, and a third conductive blind hole 1003 aligned with and electrically connected to the first conductive blind hole 1001. The first conductive blind hole 1001 passes through the first insulating layer 40, the first conductive circuit layer 20, and the substrate 10 in that order. The third conductive blind hole 1003 passes through the third conductive circuit layer 80 and the third insulating layer 60. Thus the first conductive hole 110 electrically connects the third conductive circuit layer 80, the first conductive circuit layer 20, and the second conductive circuit layer 30.

The second conductive hole 120 includes a second conductive blind hole 1002, and a fourth conductive blind hole 1004 aligned with and electrically connected to the second conductive blind hole 1002. The second conductive blind hole 1002 passes through the second insulating layer 50, the second conductive circuit layer 30, and the substrate 10 in that order. The fourth conductive blind hole 1004 passes through the fourth conductive circuit layer 90 and the fourth insulating layer 70. Thus the second conductive hole 120 electrically connects the fourth conductive circuit layer 90, the second conductive circuit layer 30, and the first conductive circuit layer 20.

A diameter of the first conductive blind hole 1001 gradually decreases along the direction from the first insulating layer 40 toward the second conductive circuit layer 30. A diameter of the third conductive blind hole 1003 gradually decreases along the direction from the third copper layer 81 toward the first insulating layer 40. At the connecting portion of the first conductive blind hole 1001 and the third conductive blind hole 1003, the diameter of the first conductive blind hole 1001 is bigger than the diameter of the third conductive blind hole 1003.

A diameter of the second conductive blind hole 1002 gradually decreases along the direction from the second insulating layer 50 toward the first conductive circuit layer 20. A diameter of the fourth conductive blind hole 1004 gradually decreases along the direction from the fourth copper layer 91 toward the second insulating layer 50. At the connecting portion of the second conductive blind hole 1002 and the fourth conductive blind hole 1004, the diameter of the second conductive blind hole 1002 is bigger than the diameter of the fourth conductive blind hole 1004.

The first conductive hole 110 and the second conductive hole 120 are conductive blind holes. A ratio of hole depth to hole diameter of the first conductive hole 110 is equal to or greater than 1. A ratio of hole depth to hole diameter of the second conductive hole 120 is equal to or greater than 1.

In at least one exemplary embodiment, the substrate 10 is a polyimide substrate.

In at least one exemplary embodiment, the circuit board 100 further includes a first cover layer (not shown) attached to a surface of the third conductive circuit layer 80 away from the third insulating layer 60, and a second cover layer (not shown) attached to a surface of the fourth conductive circuit layer 90 away from the fourth insulating layer 70.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A circuit board comprising:
a substrate;
a first conductive circuit layer and a second conductive circuit layer on opposite surfaces of the substrate;
a first insulating layer on a surface of the first conductive circuit layer away from the substrate;
a second insulating layer on a surface of the second conductive circuit layer away from the substrate;
a third insulating layer on a surface of the first insulating layer away from the first conductive circuit layer;
a fourth insulating layer on a surface of the second insulating layer away from the second conductive circuit layer;
a third conductive circuit layer on a surface of the third insulating layer away from the first insulating layer;
a fourth conductive circuit layer on a surface of the fourth insulating layer away from the second insulating layer;
at least one first conductive hole electrically connecting the third conductive circuit layer, the first conductive circuit layer and the second conductive circuit layer; and
at least one second conductive hole electrically connecting the fourth conductive circuit layer, the second conductive circuit layer, and the first conductive circuit layer;
wherein each first conductive hole comprise a first conductive blind hole, and a third conductive blind hole aligned with and electrically connected to the first conductive blind hole, the first conductive blind hole passes through the first insulating layer, the first conductive circuit layer, and the substrate, the third conductive blind hole passes through the third conductive circuit layer and the third insulating layer;
wherein each second conductive hole comprises a second conductive blind hole, and a fourth conductive blind hole aligned with and electrically connected to the second conductive blind hole, the second conductive blind hole passes through the second insulating layer, the second conductive circuit layer, and the substrate, the fourth conductive blind hole passes through the fourth conductive circuit layer and the fourth insulating layer.

2. The circuit board of claim 1, wherein the substrate is a polyimide substrate.

3. The circuit board of claim 1, wherein a ratio of hole depth to hole diameter of each first conductive hole is equal to or greater than 1.

4. The circuit board of claim 1, wherein a ratio of hole depth to hole diameter of each second conductive hole is equal to or greater than 1.

5. The circuit board of claim 1, wherein a diameter of the first conductive blind hole gradually decreases along a direction from the first insulating layer toward the second conductive circuit layer, a diameter of the third conductive blind hole gradually decreases along a direction from the third copper layer toward the first insulating layer, at a connecting portion of the first conductive blind hole and the third conductive blind hole, the diameter of the first conductive blind hole is greater than the diameter of the third conductive blind hole.

6. The circuit board of claim 1, wherein a diameter of the second conductive blind hole gradually decreases along a direction from the second insulating layer toward the first conductive circuit layer, a diameter of the fourth conductive blind hole gradually decreases along a direction from the fourth copper layer toward the second insulating layer at a connecting portion of the second conductive blind hole and the fourth conductive blind hole, the diameter of the second conductive blind hole is greater than the diameter of the fourth conductive blind hole.

7. A method for making a circuit board comprising:
providing a copper clad laminate, the copper clad laminate comprises a substrate, a first copper layer, and a second copper layer, the first copper layer and the second copper layer are on opposite surfaces of the substrate;
etching the first copper layer to form a first conductive circuit layer, and etching the second copper layer to form a second conductive circuit layer;
adding layers to form a first insulating layer on a surface of the first conductive circuit layer away from the substrate, a first conductive layer on a surface of the first insulating layer away from the first conductive circuit layer, a second insulating layer on a surface of the second conductive circuit layer away from the substrate, and a second conductive layer on a surface of the second insulating layer away from the second conductive circuit layer;
defining at least one first blind hole passing through the first conductive layer, the first insulating layer, the first conductive circuit layer, and the substrate, and defining at least one second blind hole passing through the second conductive layer, the second insulating layer, the second conductive circuit layer, and the substrate;
plating copper in each first blind hole to form at least one first conductive blind hole, and plating copper in each second blind hole to form at least one second conductive blind hole;
removing the first conductive layer and the second conductive layer;
adding layers to form a third insulating layer on a surface of the first insulating layer away from the first conductive circuit layer, a third copper layer on a surface of the third insulating layer away from the first insulating layer, a fourth insulating layer on a surface of the second insulating layer away from the second conductive circuit layer, and a fourth copper layer on a surface of the fourth insulating layer away from the second insulating layer;
defining at least one third blind hole through the third copper layer and the third insulating layer, and defining at least one fourth blind hole through the fourth copper layer and the fourth insulating layer, each third blind hole is interconnected with one of the at least one first blind hole, each fourth blind hole is interconnected with one of the at least one second blind hole;
plating copper in each third blind hole to form at least one third conductive blind hole, and plating copper in each fourth blind hole to form at least one fourth conductive blind hole.

8. The method of claim 7, further comprises etching the third copper layer to form a third conductive circuit layer after plating copper in each third blind hole to form at least one third conductive blind hole, and etching the fourth copper layer to form a fourth conductive circuit layer after plating copper in each fourth blind hole to form at least one fourth conductive blind hole.

9. The method of claim 7, wherein the substrate is a polyimide substrate.

10. The method of claim 7, wherein the first conductive layer and the second conductive layer are made of copper, aluminium, gold, silver, platinum, conductive plastic, or conductive rubber.

11. The method of claim 7, wherein each third conductive blind hole coordinates with one of the at least one first conductive blind hole to form a first conductive hole, a ratio of hole depth to hole diameter of the first conductive hole is equal to or greater than 1.

12. The method of claim 7, wherein each fourth conductive blind hole is conductive with one of the at least one second blind hole to form a second conductive hole, a ratio of hole depth to hole diameter of the second conductive hole is equal to or greater than 1.

13. The method of claim 7, wherein a diameter of each first conductive blind hole gradually decreases along a direction from the first insulating layer toward the second conductive circuit layer, a diameter of each third conductive blind hole gradually decreases along a direction from the third copper layer toward the first insulating layer.

14. The method of claim 7, wherein each first conductive blind hole and each third conductive blind hole define a connecting portion, a diameter of each first conductive blind hole is greater than a diameter of each third conductive blind hole at the connecting portion.

15. The method of claim 7, wherein a diameter of each second conductive blind hole gradually decreases along a direction from the second insulating layer toward the first conductive circuit layer, a diameter of each fourth conductive blind hole gradually decreases along a direction from the fourth copper layer toward the second insulating layer.

16. The method of claim 15, wherein each second conductive blind hole and each fourth conductive blind hole define a connecting portion, a diameter of each second conductive blind hole is greater than a diameter of each fourth conductive blind hole at the connecting portion.

17. The method of claim 7, wherein when plating copper in each third blind hole, a fifth copper layer is formed on a surface of the third copper layer away from the third insulating layer, and when plating copper in each fourth blind hole, a sixth copper layer is formed on a surface of the fourth copper layer away from the fourth insulating layer.

18. The method of claim 17, wherein the third copper layer and the fifth copper layer are etched to form the third conductive circuit layer, the fourth copper layer and the sixth copper layer are etched to form the fourth conductive circuit layer.

* * * * *

UNITED STATES PATENT AND TRADEMARK OFFICE
CERTIFICATE OF CORRECTION

PATENT NO. : 10,010,001 B1
APPLICATION NO. : 15/841773
DATED : June 26, 2018
INVENTOR(S) : Meng-Lu Jia and Hai-Bo Qin Page 1 of 1

It is certified that error appears in the above-identified patent and that said Letters Patent is hereby corrected as shown below:

On the Title Page

Please replace Item (73) regarding "Assignees" with the following:
(73) Avary Holding (Shenzhen) Co., Limited., Shenzhen (CN)
HongQiSheng Precision Electronics (QinHuangDao) Co., Ltd., Qinhuangdao (CN)

Signed and Sealed this
Twenty-eighth Day of May, 2019

Andrei Iancu
*Director of the United States Patent and Trademark Office*